(12) United States Patent
Hilburn et al.

(10) Patent No.: US 9,433,114 B2
(45) Date of Patent: Aug. 30, 2016

(54) SERVICE SHELF FOR ELECTRONIC CABINET

(71) Applicant: International Business Machines Corporation, Armonk, NY (US)

(72) Inventors: John C. Hilburn, Austin, TX (US); Christopher M. Marroquin, Rochester, MN (US); Tristan A. Merino, Austin, TX (US); Stephen P. Mroz, Rochester, MN (US); Scott A. Shurson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/228,712

(22) Filed: Mar. 28, 2014

(65) Prior Publication Data
US 2015/0282377 A1    Oct. 1, 2015

(51) Int. Cl.
| H05K 7/14 | (2006.01) |
| H05K 5/02 | (2006.01) |
| H05K 7/18 | (2006.01) |
| G06F 1/18 | (2006.01) |
| H02B 1/42 | (2006.01) |

(52) U.S. Cl.
CPC ............. *H05K 5/0204* (2013.01); *H05K 7/14* (2013.01); *H05K 7/1488* (2013.01); *H05K 7/1489* (2013.01); *H05K 7/183* (2013.01); *H05K 7/186* (2013.01); *G06F 1/183* (2013.01); *H02B 1/42* (2013.01); *H05K 7/1402* (2013.01); *H05K 7/1411* (2013.01); *H05K 7/1421* (2013.01)

(58) Field of Classification Search
CPC .................................................. H05K 5/0204
See application file for complete search history.

(56) References Cited

U.S. PATENT DOCUMENTS

| 2,572,617 | A | * | 10/1951 | Haury | H05K 7/16 211/90.01 |
| 2,572,618 | A | * | 10/1951 | Haury | H05K 7/06 211/101 |
| 2,798,780 | A | * | 7/1957 | Motorney | B60N 3/004 108/13 |
| 2,920,244 | A | * | 1/1960 | Miksit | H05K 7/14 108/11 |

(Continued)

FOREIGN PATENT DOCUMENTS

WO    2007039097 A1    4/2007

OTHER PUBLICATIONS

Unknown, "Generic Rackmount System," Installation Instructions, Kit P/N: 1USHL-112, 4 pages http://www.racksolutions.com/aitdownloadablefiles/download/aitfile/aitfile_id/610/.

*Primary Examiner* — Joshua J Michener
*Assistant Examiner* — Chiedu Chibogu
(74) *Attorney, Agent, or Firm* — Robert C. Bunker; Feb Cabrasawan

(57) ABSTRACT

A shelf device facilitates access to electronic modules within an enclosure having multiple vertically stacked levels of module storage locations. A pair of support arms each have an attachment structure on a distal portion of the support arm that is designed to attach to a first one of the vertically stacked levels. A guide rail extends from the distal portion of the support arm toward a proximal portion of the support arm. A cross brace structure is configured to pivotally attach to distal portions of the pair of support arms and a proximal portion of a first one of the support arms. A pair of vertical braces are each configured to pivotally attach to a respective one of the pair of support arms and having a detachable connection structure that is designed to attach to a second one of the vertically stacked levels.

17 Claims, 10 Drawing Sheets

(56) References Cited

U.S. PATENT DOCUMENTS

| | | | | |
|---|---|---|---|---|
| 3,601,432 A * | 8/1971 | Fenwick | ............... | A47B 57/40 211/182 |
| 3,826,207 A | 7/1974 | Sutherlan | | |
| 3,925,710 A * | 12/1975 | Ebert | ............... | H05K 7/1424 174/16.1 |
| 4,371,083 A * | 2/1983 | Zingrini | ............... | H05K 7/183 211/187 |
| 4,880,196 A * | 11/1989 | Eichenlaub | ......... | H05K 5/0204 248/165 |
| 5,176,462 A * | 1/1993 | Chen | ............... | A47F 5/105 160/135 |
| 6,201,690 B1 | 3/2001 | Moore et al. | | |
| 6,452,805 B1 * | 9/2002 | Franz | ............... | G02B 6/4471 174/154 |
| 6,568,542 B1 * | 5/2003 | Chen | ............... | H04Q 1/06 211/26 |
| 7,757,349 B2 * | 7/2010 | Laursen | ............... | H04Q 1/09 16/358 |
| 7,952,883 B2 * | 5/2011 | Hidaka | ............... | H05K 7/16 312/223.1 |
| 8,152,249 B2 | 4/2012 | Becklin | | |
| 8,408,404 B2 | 4/2013 | Miller et al. | | |
| 8,479,928 B2 | 7/2013 | Tanabe et al. | | |
| 8,893,443 B2 * | 11/2014 | Davis | ............... | B62B 3/02 182/150 |
| 9,074,722 B1 * | 7/2015 | Phillips | ............... | F16M 13/02 |
| 2001/0026436 A1 * | 10/2001 | Tanzer | ............... | H01R 25/006 361/725 |
| 2002/0084089 A1 * | 7/2002 | Holt | ............... | H02B 1/308 174/50 |
| 2004/0228098 A1 * | 11/2004 | Robbins | ............... | H01R 25/006 361/725 |
| 2004/0264147 A1 * | 12/2004 | Shimizu | ............... | H05K 7/1421 361/726 |
| 2005/0225217 A1 * | 10/2005 | Nay | ............... | A47B 21/0314 312/208.1 |
| 2009/0302727 A1 * | 12/2009 | Vincent | ............... | H05K 7/1488 312/326 |
| 2010/0038328 A1 | 2/2010 | Becklin | | |
| 2010/0307998 A1 * | 12/2010 | Chen | ............... | A47F 5/0043 211/184 |
| 2011/0043986 A1 * | 2/2011 | Conn | ............... | H05K 7/1492 361/679.02 |
| 2012/0120611 A1 * | 5/2012 | Ni | ............... | H05K 7/1485 361/727 |
| 2012/0248047 A1 | 10/2012 | Tanabe et al. | | |
| 2012/0248049 A1 | 10/2012 | Moore | | |
| 2013/0083471 A1 * | 4/2013 | Zhou | ............... | G11B 33/124 361/679.31 |
| 2013/0214105 A1 * | 8/2013 | Herder | ............... | F16M 13/02 248/205.1 |
| 2014/0116970 A1 * | 5/2014 | Hsu | ............... | H05K 7/1488 211/26 |

* cited by examiner

SERVICE SHELF FOR ELECTRONIC CABINET

BACKGROUND

The present disclosure relates to a service shelf for a rack cabinet, and more specifically, to a shelf configured to attach to a rack cabinet to facilitate access to electronic modules stored within the rack cabinet.

Equipment designed to be placed in a rack can be described as a rack-mount, a rack-mount instrument, a rack mounted system, a rack mount chassis, sub-rack or rack mountable. The height of the electronic modules can also be standardized as multiples (e.g., 1.75 inches) or one rack unit or U. For instance, one industry standard defines a rack cabinet as 42U tall. Other sizes are possible as well. Some electronic components or modules (e.g., servers, storage devices, network switches, monitoring devices and the like) can be multiple rack units in size and correspondingly may be very heavy and difficult to move.

SUMMARY

According to embodiments of the present disclosure, a system includes a shelf device for facilitating access to electronic modules within an enclosure having multiple vertically stacked levels of module storage locations. A pair of support arms can each have an attachment structure on a distal portion of the support arm that is designed to attach to a first one of the vertically stacked levels. A guide rail extends from the distal portion of the support arm toward a proximal portion of the support arm and, while the support arms are attached to one of the vertically stacked levels, is designed to guide movement of the electronic module toward the proximal portion of the support arm. A cross brace structure is configured to pivotally attach to distal portions of the pair of support arms and a proximal portion of a first one of the support arms and has a locking connection structure that is designed to attach to a proximal portion of a second one of the support arms. A pair of vertical braces are each configured to pivotally attach to a respective one of the pair of support arms and have a detachable connection structure that is designed to attach to a second one of the vertically stacked levels.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
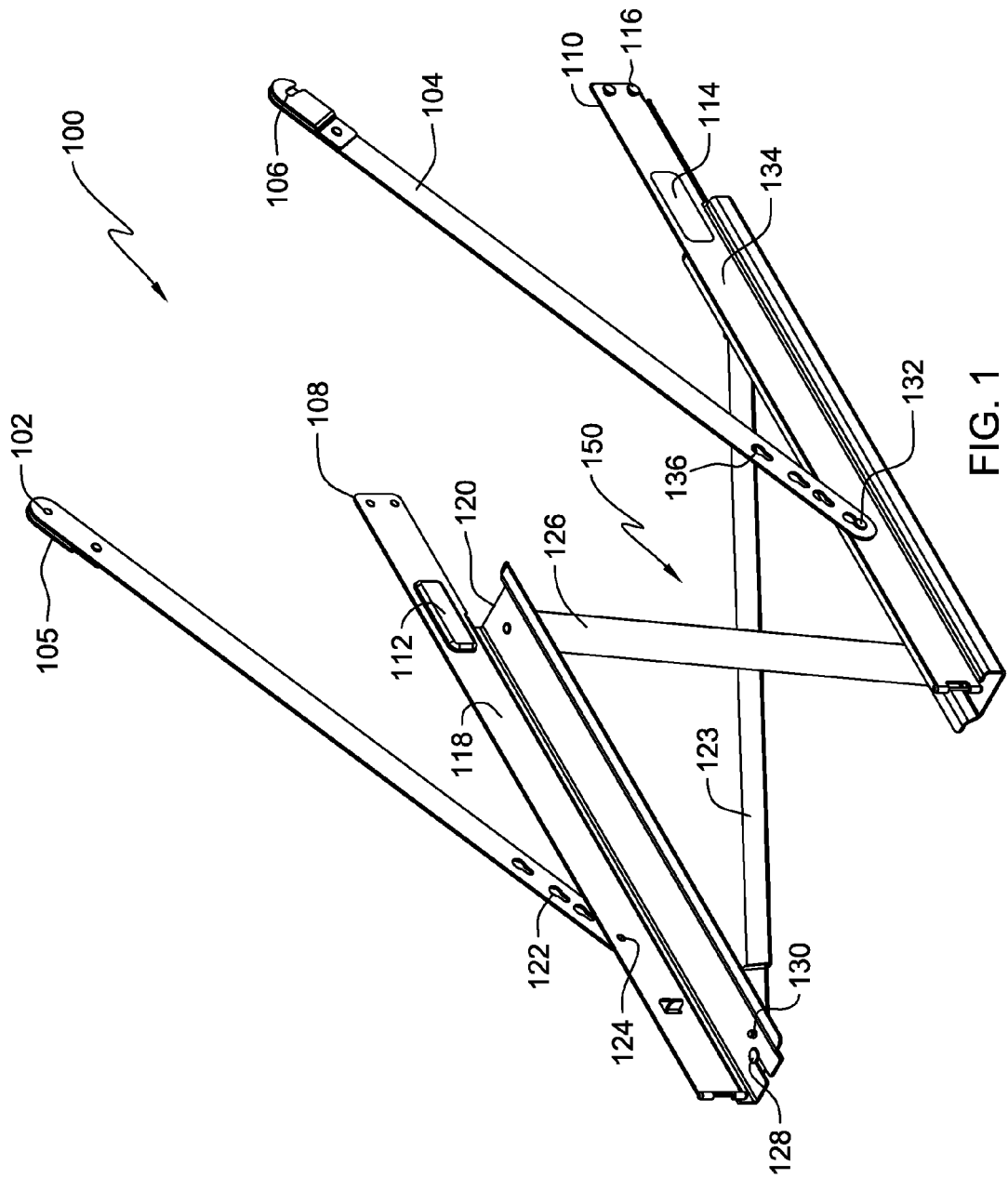
FIG. 1 depicts an unattached shelf device, consistent with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to support structures for electronic module enclosures, more particular aspects relate to a shelf configured to attach to a rack cabinet to facilitate access to electronic modules stored within the cabinet. While the present disclosure is not necessarily limited to such applications, various aspects of the disclosure may be appreciated through a discussion of various examples using this context.

Various embodiments of the present disclosure are directed toward a shelf device that is designed for use with a rack cabinet with multiple vertically stacked levels of module storage locations. The shelf device can be designed to attach to rack cabinets at different rack levels and allow for the corresponding equipment module to be moved from its operational location within the rack cabinet to an external location on the shelf device.

Certain embodiments are directed toward a shelf device that is designed to collapse when not in use. This can be useful for ease of storage and transport. The shelf device can include vertical braces that are configured to attach to the rack cabinet in order to provide vertical support for the shelf. For instance, the vertical braces can extend from a proximal portion of the shelf device to a location on the rack cabinet. The term proximal is used relative to a view of the shelf device from the front of the rack cabinet while the distal portion of the shelf device is attached to the rack cabinet. In various embodiments, the location at which the vertical braces are attached can correspond to a rack level above or below the rack level of the electronic module to be placed on the shelf device. Thus, the vertical braces can provide support for the weight of the electronic module as it is positioned onto the shelf device.

According to embodiments, the shelf device can be configured to attach to a rack cabinet or enclosure that uses a standardized form factor to allow for the mounting of multiple equipment modules. For instance, the frame can conform to a 19 inch wide form factor where each module has a front panel that is 19 inches wide. The height of the electronic modules can also be configured to conform to standardized sizes, such as multiples of 1.75 inches, or one rack unit or "U." The rack cabinets can be of varying heights (e.g., 42U tall) and the shelf device can be designed to attach to multiple positions, each position corresponding to a rack unit and potential location for an equipment module.

Aspects of the present disclosure are directed toward the recognition that servicing heavy modules can place a great burden on the users performing the service action. For instance, some modules can weigh more than one person can safely move or carry. Thus, the service person may end up using additional people to help remove the heavy modules from the enclosure (e.g., in order to move the modules to a workbench for the service action). Alternately, the service person might procure a mechanical lift to support the weight of the system as it is slid out of the enclosure. Many lift structures block one or more sides of a module, which can inhibit the ability to service the module. Moreover, the large size of a lift creates storage issues and lifts can be expensive to purchase.

Embodiments of the present disclosure are directed toward a service shelf device that can support a heavy module, while facilitating servicing by a single person. Various embodiments are directed toward a shelf device that collapses to a small size for easy storage and transport.

Turning now to the figures, FIG. 1 depicts an unattached shelf device, consistent with embodiments of the present disclosure. The shelf device 100 can include a pair of support arms 108, 110 that each includes an attachment structure 116 on a distal portion of the support arm. The attachment structure can be designed to attach to vertically stacked levels (rack unit locations) of an enclosure. The attachment structure can include, but is not necessarily limited to, protrusions, screw holes, screws, bolts and pins that can be inserted into receptacles of the enclosure. Each arm can also include a support platform 120 upon which the electronic module can rest when it is taken out of the enclosure.

Consistent with some embodiments, a guide rail 118, 134 can extend from the distal portion of each support arm toward a proximal portion of the support arm. The guide rail can be designed to guide movement of the electronic module longitudinally along the support arm by inhibiting lateral movement. In certain embodiments, the guide rail can include an embossed portion 112, 114. The embossed portions can help to guide the electronic module by creating a point at which there is a smaller distance between the arms. Moreover, the embossed portions can provide additional strength to the guide rails.

A cross brace structure 150 can provide structural support for the support arms. The cross brace structure can include cross bars 126, 123, that are each pivotally attached to the distal portions of the support arms. A proximal portion of (a first) one of the cross bars 123 can include a locking connection structure that is designed to attach to a proximal portion of a support arm 108. For instance, the locking connection structure can include a protrusion element 128 that fits into a corresponding cutout in the support arm 108 and also include a pin 130 that fits into a corresponding hole in the support arm 108. When fastened in this manner, the locking connection structure can prevent pivoting of the cross bar about the attachment point on the support arm 110. The other cross bar 126, can be pivotally attached to both support arms 108, 110. Other configurations are also possible including, but not necessarily limited to, each cross bar including the locking connection structure.

The shelf device can also include a pair of vertical braces 102, 104 that are each pivotally attached to a respective one of the pair of support arms at locations 124, 132. A detachable connection structure 106 can be designed to attach to both the first and a second one of the vertically stacked levels. When the vertical braces are attached to a different level, they can provide additional support to the support arms 108, 110. Adjustable attachment points 122, 136 can be used to allow the vertical braces to be attached to the vertically stacked levels at different angles. This can be particularly useful for when the electronic module being removed is at different vertical locations within the enclosure.

The vertical braces are depicted as extending above the support arms; however, embodiments allow for the vertical braces to attach below the support arms. Various embodiments also allow for two sets of vertical braces, one below and one above the support arms. Particularly heavy electronic modules cause a significant amount of downward force being transferred to the vertical braces. Aspects of the present disclosure relate to the recognition that the ability of vertical braces (e.g., made from sheet metal) to provide support can be significantly more when under tension than when under compression. Accordingly, certain embodiments are designed to attach the vertical braces to a level on the enclosure that is above the level of the electronic module being supported so that downward force creates tension in the vertical braces.

Figure 2:
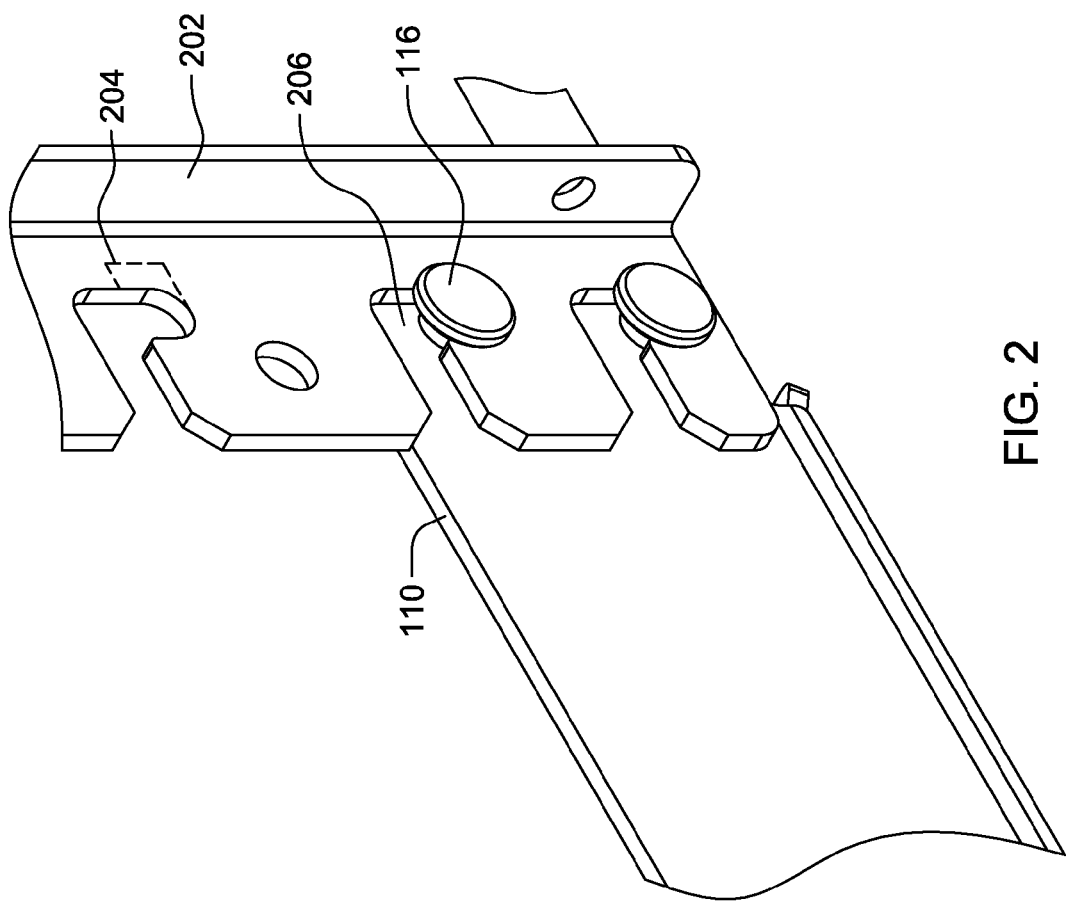
FIG. 2 depicts an attachment structure for a support arm, consistent with embodiments of the present disclosure.

FIG. 2 depicts an attachment structure for a support arm, consistent with embodiments of the present disclosure. The support arm 110 is shown as being attached to an enclosure that includes a receiving structure 202. The receiving structure can include a plurality of L-shaped openings 206 into which attachment structure (protrusions) 116 can be placed. In some embodiments, the protrusions can have a T shape that helps to prevent the protrusion from unintentionally slipping out of the openings. Optional embodiments include an additional cutout 204 within the L-shaped openings (shown by the dashed line). The protrusion may slide into the cutout, which thereby prevents exit from the L-shaped opening in response to an unintended force that might otherwise disengage the shelf device from the receiving structure.

The receiving structure 202 can be useful for providing additional strength and for simplifying the process of attaching the shelf device to the enclosure. In some embodiments, the receiving structure can be attached to the outside of the enclosure using fasteners such as, but not necessarily limited to, screws, bolts, pins or latches.

Various embodiments are directed toward an attachment structure that is designed to attach directly to an enclosure without the use of a separate receiving structure 202. An enclosure may include a plurality of external connection points, such as threaded screw holes or unthreaded holes. The attachment structure 116 can be configured accordingly. This may include, for instance, an L-shaped flange or bracket on the portion of the support arm 110 that includes holes for inserting screws, bolts or pins.

Figure 3:
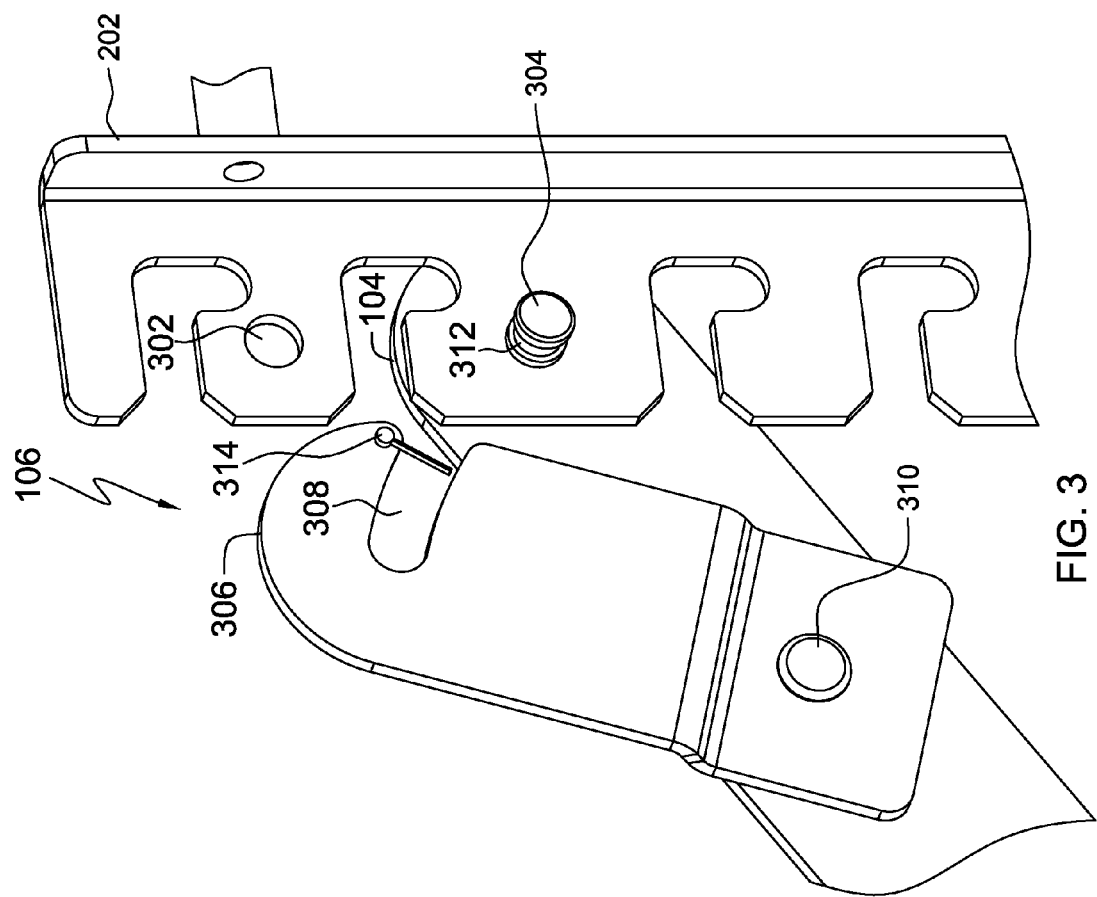
FIG. 3 depicts a detachable connection structure for a vertical brace, consistent with embodiments of the present disclosure.

FIG. 3 depicts a detachable connection structure for a vertical brace, consistent with embodiments of the present disclosure. The receiving structure 202 can include one or more attachment holes 302. The vertical brace can include a detachable connection structure 106, which can include a protrusion element 304. The protrusion element 304 can be designed to fit into the attachment holes 302 and to provide support for the vertical brace and the shelf device. In some embodiments, the vertical brace has enough flexibility to allow the protrusion element to be inserted and removed from the holes 302. In some embodiments, the protrusion element can include a spring loaded extension that facilitates insertion and removal (e.g., reducing the need to flex or bend the vertical brace during insertion or removal).

In various embodiments, a locking arm 306 can be used to prevent the protrusion element from exiting the holes. For instance, the locking element can be designed to pivot along attachment point 310. The protrusion element 304 can slide into the opening or recess 308 after the protrusion element has been inserted into a hole. The locking element will then prevent the vertical brace 104 from moving inward and thereby keep the protrusion element 304 within the hole.

In some embodiments, the protrusion element 304 can include a groove 312 that the locking element fits into. The locking element can also include a latching device 314 that allows the protrusion element to enter the opening, while preventing exiting of the protrusion element without manual intervention from a user of the shelving device. For instance, the latching device 314 could be allowed to rotate inward (toward the opening and relative to the depicted position) when the protrusion is inserted. Once fully inserted, the latching device 314 can return to the depicted position while being designed to not rotate further outward. To release the vertical brace, the user manually pushes the latching device 314 inward and then lifts the locking arm 306.

Figure 4:
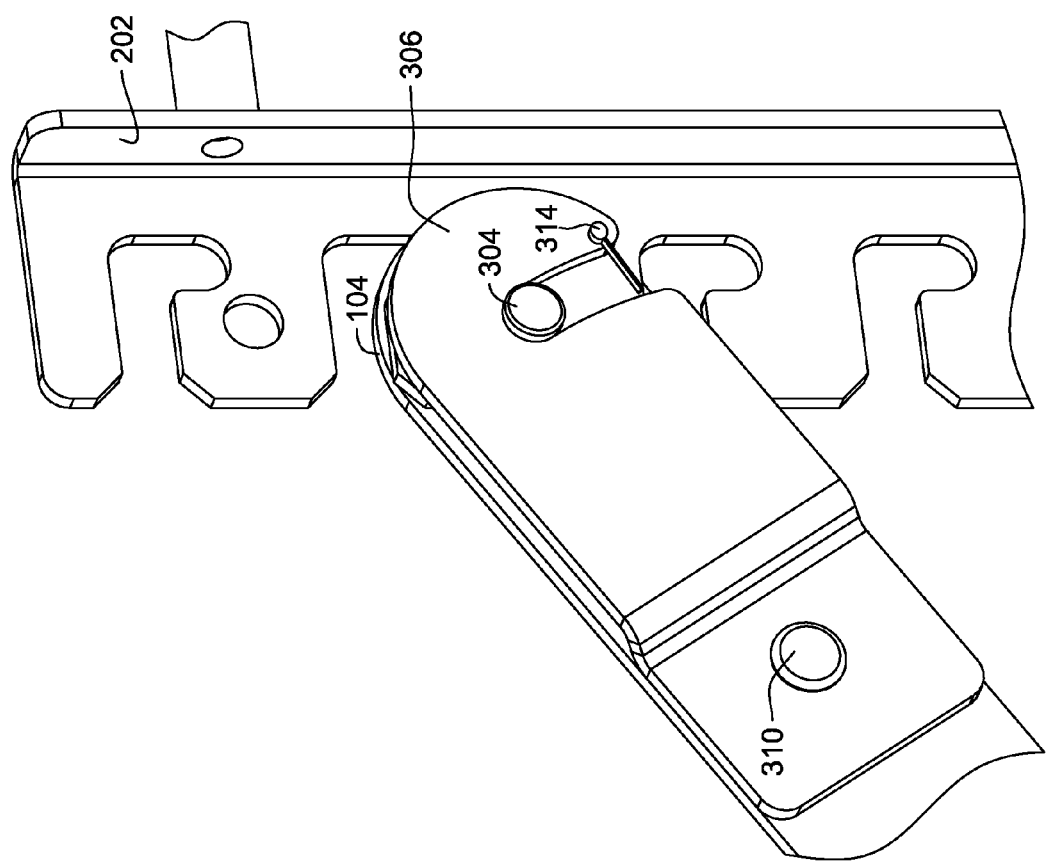
FIG. 4 depicts a detachable connection structure for a vertical brace in an engaged position, consistent with embodiments of the present disclosure.

FIG. 4 depicts a detachable connection structure for a vertical brace in an engaged position, consistent with embodiments of the present disclosure. The vertical arm 104 has been positioned to allow the protrusion element 304 to be inserted into a hole of the receiving structure 202. The locking arm 306 has been rotated about attachment point 310 and positioned to prevent the protrusion element 304 from leaving the hole. Latching device 314 can be used to prevent the locking arm 306 from rotating in the opposite direction and thereby allowing the protrusion element 304 to be taken out of the hole so that the vertical arm can be removed.

Figure 5:
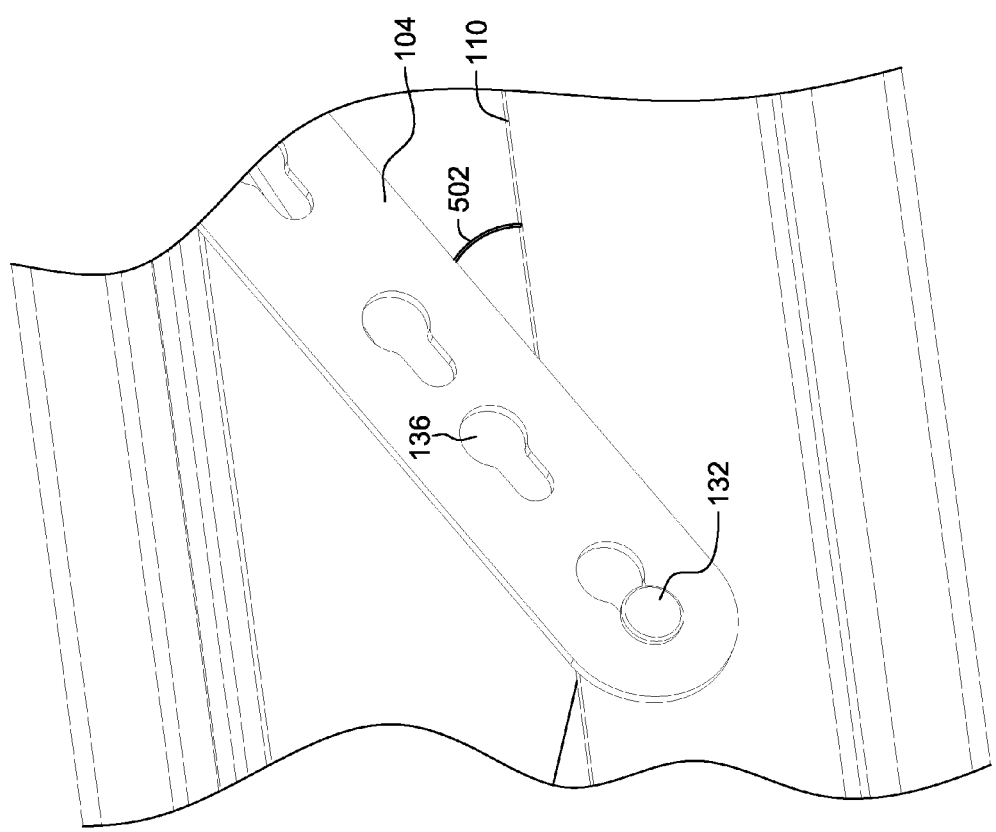
FIG. 5 depicts a vertical brace as attached to a support arm, consistent with embodiments of the present disclosure.

FIG. 5 depicts a vertical brace as attached to a support arm, consistent with embodiments of the present disclosure. Vertical brace 104 can be configured with adjustable attachment points 136 that are placed at different locations along the length of the brace. In some embodiments, the attachment points can be keyhole shapes that are designed to pivotally attach to a protrusion at attachment point 132. The different attachment points can be selected depending upon the desired angle 502 of the vertical brace relative to the support arm 110. For instance, FIG. 5 shows the vertical brace attached at a first attachment point for which the angle 502 is relatively large. This allows for the vertical brace to attach to a level of the enclosure that is relatively far from the level containing the electronic module to be placed upon the shelf device. The other attachment points can be used to reduce the angle and attach to a correspondingly closer level. This can be particularly useful for when the electronic module is located in a level that is close to the top of the enclosure.

Consistent with various embodiments, the attachment points can include other fastener solutions. For instance, the support arm can include a hole (key or otherwise) and the vertical brace can include a protrusion designed to lock into the hole. In another example, both the vertical brace and the support arm can include one or more holes and a pin, screw, bolt or similar component can be used to fasten the brace and arm together. Other fasteners are also possible.

Figure 6:
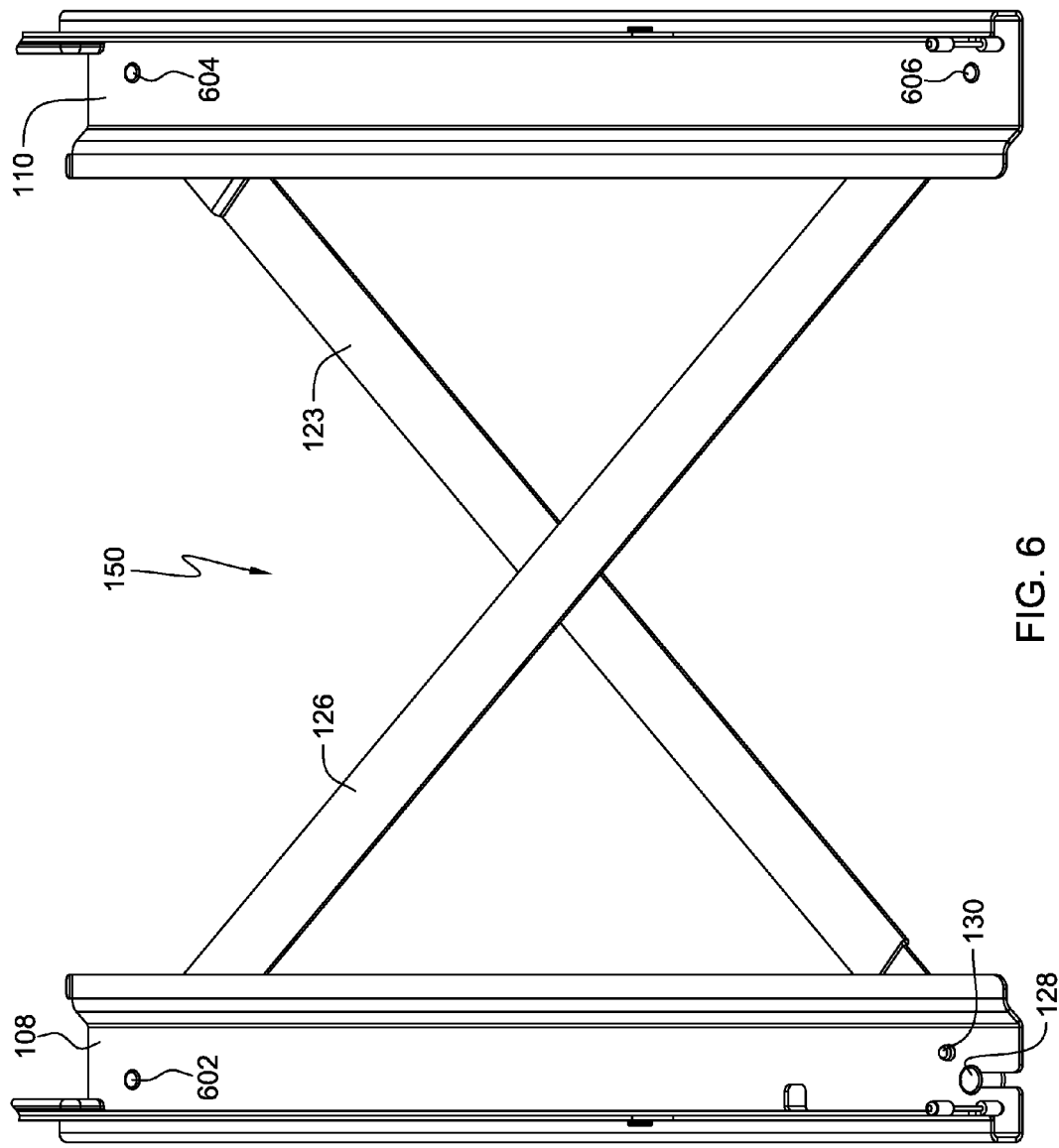
FIG. 6 depicts a top down view of a shelf device, consistent with embodiments of the present disclosure.

FIG. 6 depicts a top down view of a shelf device, consistent with embodiments of the present disclosure. As depicted, the shelf device has the vertical braces removed. Support arms 108, 110 are held in place by cross brace structure 150, which includes cross bars 126, 123. Cross bars 126, 123 can be pivotally attached (e.g., using a spin rivet) to a distal portion of the support arms at locations 602 and 604, respectively. Cross bar 126 can also be pivotally attached to a proximal portion of the support arm 110 at location 606.

As discussed herein, a proximal portion of the cross bar 123 can include a locking connection structure that is designed to attach to a proximal portion of a support arm 108. For instance, the locking connection structure can include a protrusion element 128 that fits into a corresponding cutout or recess in the support arm 108 and also include a pin 130 that fits into a corresponding hole in the support arm 108.

Consistent with embodiments of the present disclosure the shelf device can be configured to collapse when not in use to allow for ease of transport and storage. This can be accomplished by disconnecting the proximal portion of a support arm 108 from the cross bar 123, which allows for cross bar 126 to pivot relative to support arms 108, 110 and thereby bring the support arms together.

Figure 7:
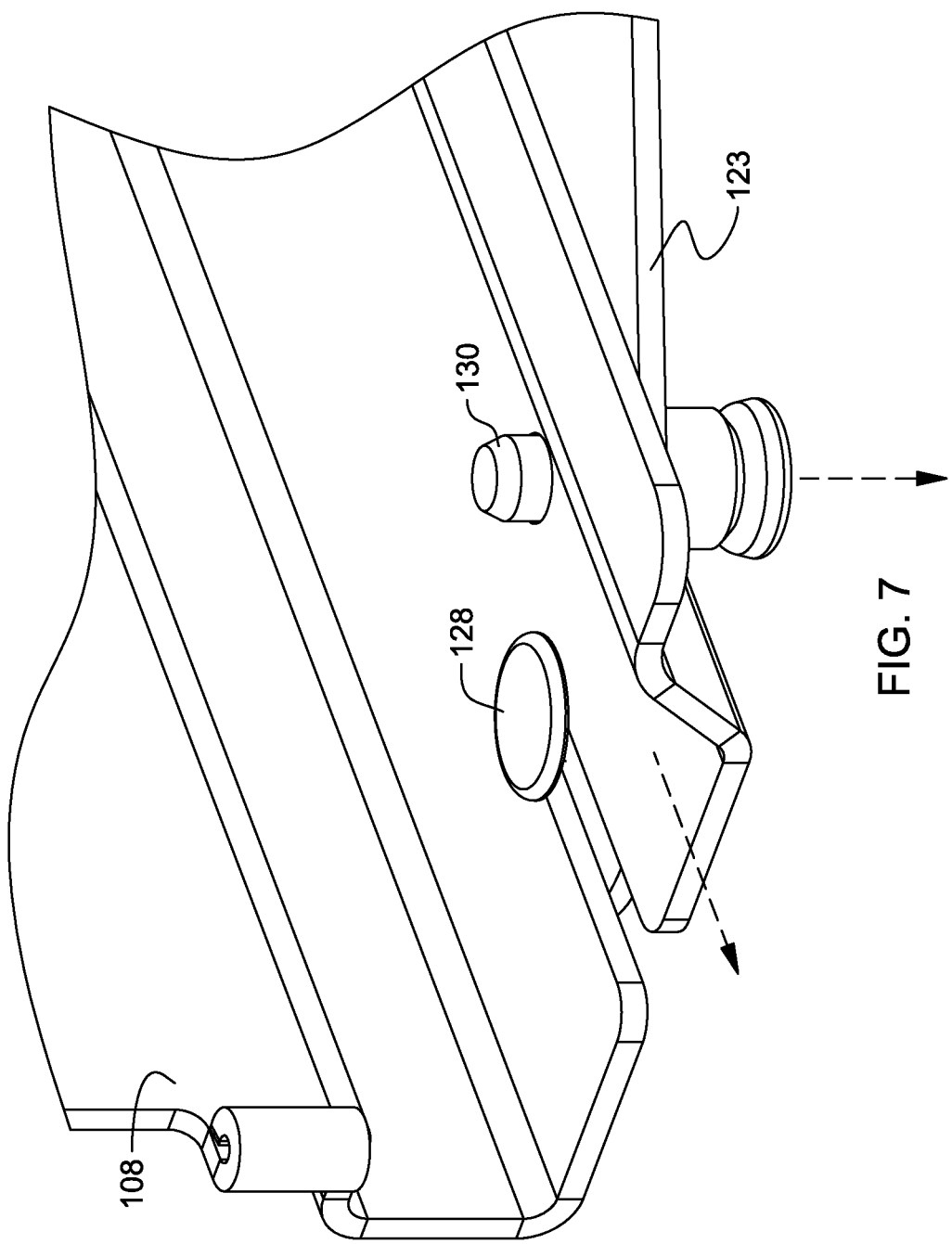
FIG. 7 shows a close up view of a locking connection structure, consistent with embodiments of the present disclosure.

FIG. 7 shows a close up view of a locking connection structure, consistent with embodiments of the present disclosure. Support arm 108 is attached to the cross bar 123 using the protrusion element 128 and pin 130. The arrows depict how the protrusion element 128 and pin 130 allow for the support arm to be disconnected from the cross bar. Consistent with embodiments of the present disclosure, the pin 130 can be a plunger pin or a spring-loaded pin that automatically inserts into the hole of the support arm once properly positioned. Once inserted, the pin can inhibit rotation of the cross brace structure relative to the pair of support arms.

Figure 8:
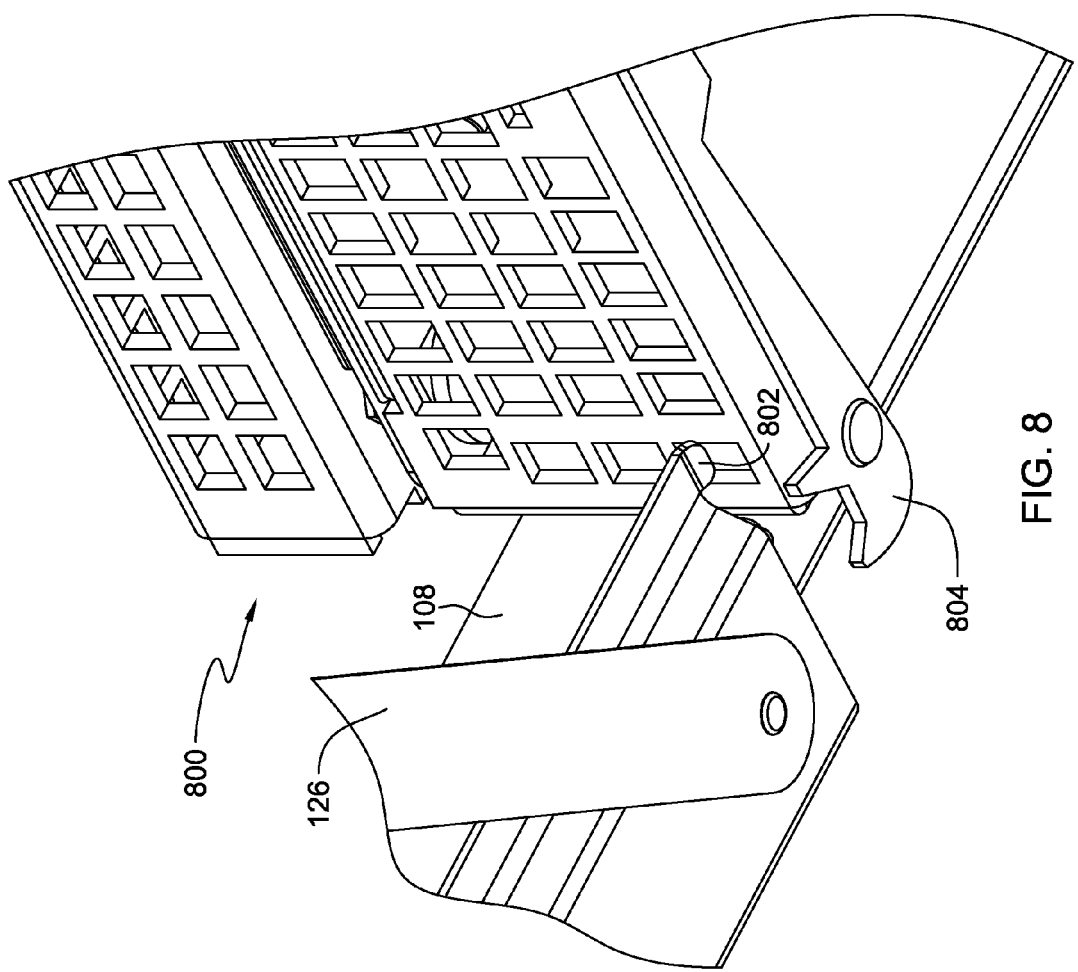
FIG. 8 depicts a view from below a support arm, consistent with embodiments of the present disclosure.

FIG. 8 depicts a view from below a support arm, consistent with embodiments of the present disclosure. The electronic module 800 is shown as having been partially removed from the enclosure, while support arm 108 is attached to the enclosure consistent with various embodiments discussed herein. Also consistent with discussions herein, cross bar 126 provides support to the shelf device. Consistent with certain embodiments and as shown more specifically in FIG. 10, the support arms can be configured to form a recess that allows the electronic module to slide partially out of the enclosure before being supported by the pair of support arms. This recess can be particularly useful for enclosures that have built in shelves that allow electronic modules to be partially pulled out of enclosure. The recess can also facilitate access to the back of the electronic module once fully removed from the enclosure. Further, the recess can make it easier for a user to grasp the electronic module during the initial removal from the enclosure. This can be particularly true when the electronic module has one or more latches 804 that are released in order to remove the module. In some instances, the latches can also provide a grip point for a user to pull on the electronic module.

Consistent with certain embodiments, the pair of support arms can each include a bevel 802 that is designed to facilitate transitioning placement of the electronic module onto the pair of support arms. For instance, as the electronic module is removed from the enclosure the front of the module may dip slightly. The bevel 802 can provide a ramp to facilitate placement onto the supporting sections of the support arms.

Figure 9:
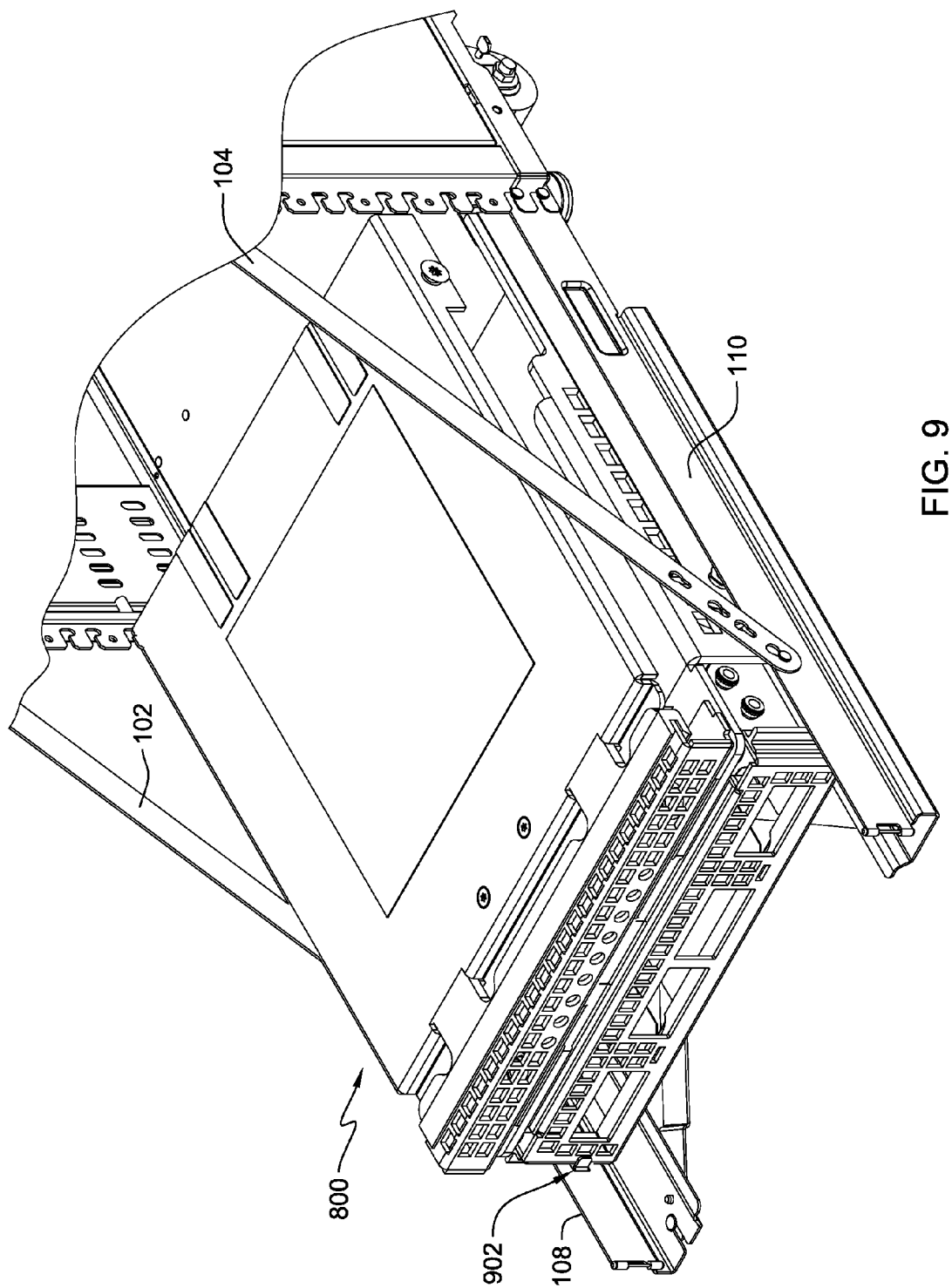
FIG. 9 depicts a shelving device in use and with an electronic module positioned thereon, consistent with embodiments of the present disclosure.

FIG. 9 depicts a shelving device in use and with an electronic module positioned thereon, consistent with embodiments of the present disclosure. Electronic module 800 rests on support arms 108, 110. Vertical braces 102, 104 are attached to the enclosure and provide additional structural support for the weight of the electronic module 800. Optional stop 902 can be used to prevent the electronic module from sliding too far out onto the shelve device. As shown in FIG. 9, the shelving device can be designed to allow access to all sides of the electronic module, including the back side.

With the system in the service position as shown in FIG. 9, a service personnel may walk away to grab tools, and may perform the service action while the system rests on the shelf. After the service action is completed, the system may be slid back into the chassis. Embodiments of the present disclosure are directed toward a shelf device that is open in the front in order to allow a user pressing on the front of the system to install it back into the chassis or enclosure. This facilitates the insertion of (possibly) heavy modules back into the chassis. The shelf device can be removed in the reverse order that it was installed. It may also be collapsed and stored until the next service event.

Figure 10:
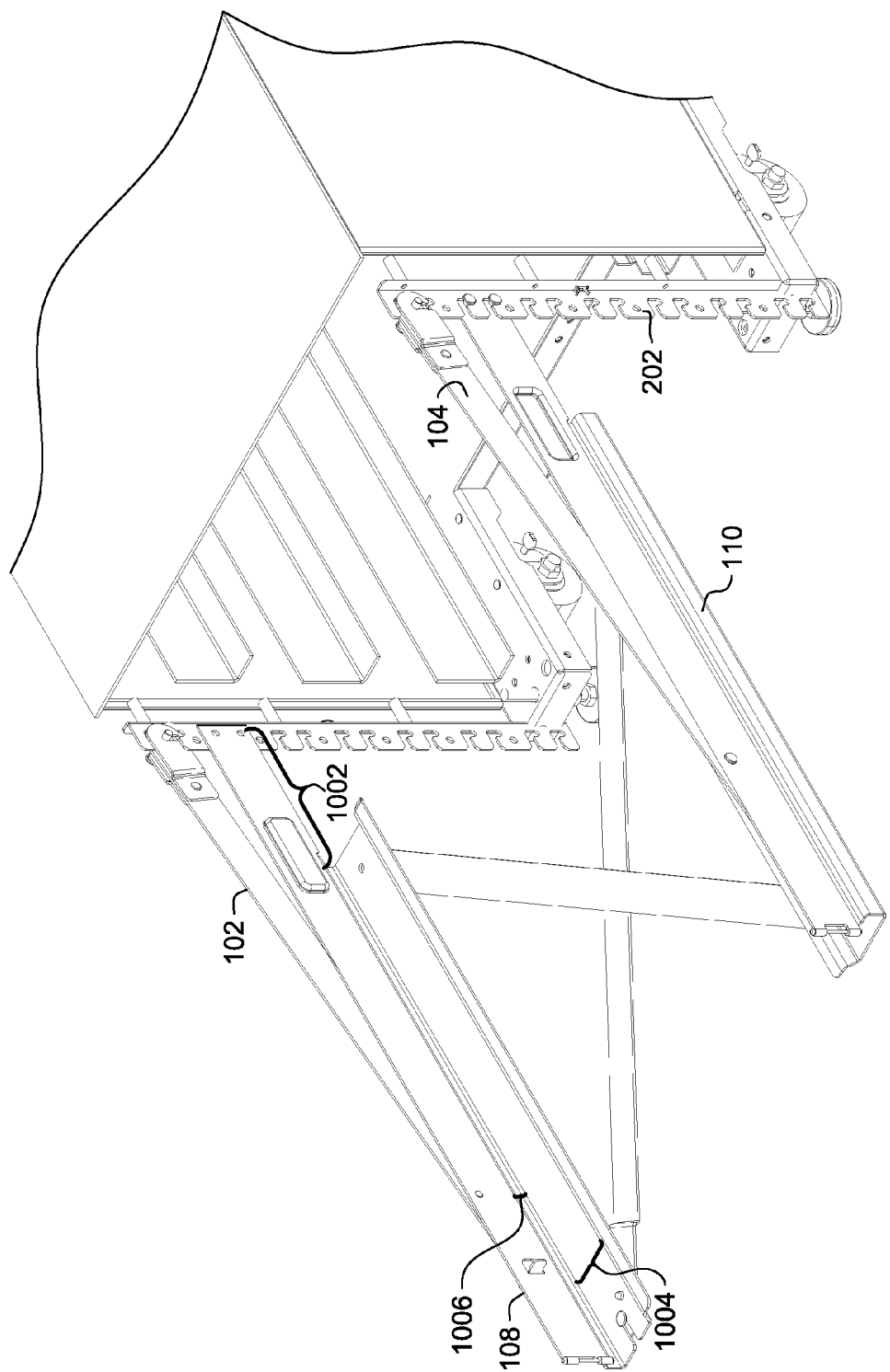
FIG. 10 depicts a shelving device attached to an enclosure near the top level, consistent with embodiments of the present disclosure.

FIG. 10 depicts a shelving device attached to an enclosure near the top level, consistent with embodiments of the present disclosure. The support arms 108, 110 are connected to the receiving structure 202 at a relatively high level (rack unit location). The vertical braces 102, 104 are correspondingly shown in a configuration with a small angle relative to the support arms. Also depicted is recess 1002, the size of which can be set according to how far a built in sliding shelf extends from the enclosure.

Consistent with certain embodiments, the support arms can include a recessed portion or track 1004. This can be particularly useful for providing extra room to grasp latches of the electronic module, such as the latch depicted in FIG. 8. In some instances, the latch may extend beyond the normal footprint of the electronic module when disengaged with the enclosure. Accordingly, the shelving device can include a recess 1006 in the guide rail to accommodate the latch.

The various components (e.g., arms, bars, braces, pins) can be made from a variety of different materials depending on factors such as the weight of the electronic modules. A non-limiting set of possible materials include aluminum, brass, copper, steel, tin, and various types of plastics. For instance, the vertical braces and cross bars can be made from aluminum sheet metal.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system for facilitating access to electronic modules within an enclosure having multiple vertically stacked levels of module storage locations, the system comprising:
    a shelf device that includes:
        a pair of support arms each having
            an attachment structure on a distal portion of the support arm that is designed to attach to a first one of the vertically stacked levels;
            a horizontal support platform extending from the distal portion of the support arm toward a proximal portion of the support arm and that, while the support arms are attached to one of the vertically stacked levels, is designed to support weight of an electronic module by providing a horizontal surface upon which a bottom of the electronic module can rest as the electronic module is moved from the distal portion of the support arm and toward the proximal portion of the support arm;
            a vertical guide rail extending perpendicular to support platform from the distal portion of the support arm toward the proximal portion of the support arm and that, while the support arms are attached to one of the vertically stacked levels, is designed to guide movement of the electronic module toward the proximal portion of the support arm by inhibiting lateral movement of a side of the electronic module as the electronic module is moved from the distal portion of the support arm and toward the proximal portion of the support arm along the support platform;
        a cross brace structure pivotally attached to distal portions of the pair of support arms and a proximal portion of a first one of the support arms and having a locking connection structure that is designed to attach to a proximal portion of a second one of the support arms; and
        a pair of vertical braces each pivotally attached to a respective one of the pair of support arms and having a detachable connection structure that is designed to attach to a second one of the vertically stacked levels.

2. The system of claim 1, wherein the cross brace structure includes a first cross bar pivotally attached to the distal portion of the first one of the support arms, the first cross bar further designed to attach, via the locking connection structure, to the proximal portion of the second one of the support arms, wherein the cross brace structure further includes a second cross bar pivotally attached to the distal portion of the second one of the support arms and the proximal portion of the first one of the support arms, wherein the shelf device is designed to collapse the cross brace structure to bring the pair of support arms together, and
    wherein the collapsing is accomplished by detaching the locking connection structure from the proximal portion of the second one of the support arms and pivoting the second cross bar relative to the distal portion of the second one of the support arms and relative to the proximal portion of the first one of the support arms.

3. The system of claim 2, wherein the detachable connection structure is further designed to prevent the collapse of the cross brace structure while attached to the proximal portion of the second one of the support arms.

4. The system of claim 1, wherein the attachment structure includes one or more protrusions designed to be inserted into receptacles for each of the vertically stacked levels of the enclosure.

5. The system of claim 1, wherein the attachment structure includes a flange that is configured to attach to each of the vertically stacked levels of the enclosure using at least one module selected from the group consisting of screws, bolts and pins.

6. The system of claim 1, wherein the locking connection structure includes a pin that is configured to inhibit rotation of the cross brace structure relative to the pair of support arms.

7. The system of claim 1, wherein the cross brace structure further includes:

a first cross bar that is pivotally attached to the distal portion of the second one of the support arms and to the proximal portion of the first one of the support arms; and a second cross bar that is pivotally attached to the distal portion of the first one of the support arms and that includes a locking pin that is designed to inhibit pivoting of the cross brace when engaged with the first one of the support arms.

8. The system of claim 1, wherein the pair of support arms each include at least one emboss that is designed to contact that electronic module while moving toward the proximal portion of the support arm and to provide structural support.

9. The system of claim 1, wherein the shelf device that, when attached to the enclosure, form a recess that allows the electronic module to slide partially out of the enclosure before being supported by the pair of support arms.

10. The system of claim 9, wherein the pair of support arms each further include a bevel that is designed to facilitate transitioning placement of the electronic module onto the pair of support arms.

11. A shelf device for facilitating access to electronic modules within an enclosure having multiple vertically stacked levels of module storage locations that includes:
   a pair of support arms each having
      an attachment structure on a distal portion of the support arm that is designed to attach to a first one of the vertically stacked levels;
      a horizontal support platform extending from the distal portion of the support arm toward a proximal portion of the support arm and that, while the support arms are attached to one of the vertically stacked levels, is designed to support weight of an electronic module by providing a horizontal surface upon which a bottom of the electronic module can rest as the electronic module is moved from the distal portion of the support arm and toward the proximal portion of the support arm;
      a vertical guide rail extending perpendicular to the support platform from the distal portion of the support arm toward the proximal portion of the support arm and that, while the support arms are attached to one of the vertically stacked levels, is designed to guide movement of the electronic module toward the proximal portion of the support arm by inhibiting lateral movement a of side of the electronic module as the electronic module is moved from the distal portion of the support arm and toward the proximal portion of the support arm along the support platform;
   a cross brace structure configured to pivotally attach to distal portions of the pair of support arms and a proximal portion of a first one of the support arms and having a locking connection structure that is designed to attach to a proximal portion of a second one of the support arms; and
   a pair of vertical braces each configured to pivotally attach to a respective one of the pair of support arms and having a detachable connection structure that is designed to attach to a second one of the vertically stacked levels.

12. The device of claim 11, wherein the cross brace structure includes a first cross bar pivotally attached to the distal portion of the first one of the support arms, the first cross bar further designed to attach, via the locking connection structure, to the proximal portion of the second one of the support arms, wherein the cross brace structure further includes a second cross bar pivotally attached to the distal portion of the second one of the support arms and the proximal portion of the first one of the support arms, wherein the cross brace structure is configured to collapse to bring the pair of support arms together, and
   wherein the collapsing is accomplished by detaching the locking connection structure from the proximal portion of the second one of the support arms and pivoting the second cross bar relative to the distal portion of the second one of the support arms and relative to the proximal portion of the first one of the support arms.

13. The device of claim 12, wherein the detachable connection structure is further designed to prevent the collapse of the cross brace structure while attached to the proximal portion of the second one of the support arms.

14. The device of claim 11, wherein the attachment structure includes one or more protrusions designed to be inserted into receptacles for each of the vertically stacked levels of the enclosure.

15. The device of claim 11, wherein the attachment structure includes a flange that is configured to attach to each of the vertically stacked levels of the enclosure using at least one module selected from the group consisting of screws, bolts and pins.

16. The device of claim 11, wherein the locking connection structure includes a pin that is configured to inhibit rotation of the cross brace structure relative to the pair of support arms.

17. The device of claim 11, wherein the cross brace structure further includes:
   a first cross bar that is pivotally attached to the distal portion of the second one of the support arms and to the proximal portion of the first one of the support arms; and
   a second cross bar that is pivotally attached to the distal portion of the first one of the support arms and that includes a locking pin that is designed to inhibit pivoting of the cross brace when engaged with the first one of the support arms.

* * * * *